United States Patent
Snyman et al.

(10) Patent No.: US 8,674,382 B2
(45) Date of Patent: Mar. 18, 2014

(54) SEMICONDUCTOR LIGHT EMITTING DEVICE COMPRISING HETEROJUNCTION

(75) Inventors: Lukas Willem Snyman, Pretoria (ZA); Monuko Du Plessis, Pretoria (ZA)

(73) Assignee: Insiava (Pty) Limited, Pretoria (ZA)

( * ) Notice: Subject to any disclaimer, the term of this patent is extended or adjusted under 35 U.S.C. 154(b) by 326 days.

(21) Appl. No.: 12/865,609

(22) PCT Filed: Jan. 30, 2009

(86) PCT No.: PCT/IB2009/050378
§ 371 (c)(1),
(2), (4) Date: Nov. 22, 2010

(87) PCT Pub. No.: WO2009/095886
PCT Pub. Date: Aug. 6, 2009

(65) Prior Publication Data
US 2011/0068716 A1 Mar. 24, 2011

(30) Foreign Application Priority Data
Feb. 1, 2008 (ZA) .................................. 2008/01088

(51) Int. Cl.
*H01L 33/26* (2010.01)
(52) U.S. Cl.
USPC ............. 257/94; 257/186; 257/189; 257/191; 257/201; 257/183; 257/E21.48; 257/E21.088; 257/E21.23; 257/E21.579; 257/E33.013; 257/196; 257/197; 257/198; 257/199; 257/200; 438/170; 438/189; 438/202; 315/363
(58) Field of Classification Search
USPC ............. 257/80, 11, 196–201, 186, 189, 191
See application file for complete search history.

(56) References Cited

U.S. PATENT DOCUMENTS

| 5,523,592 A | 6/1996 | Nakagawa et al. |
| 5,760,417 A * | 6/1998 | Watanabe et al. ............... 257/11 |
| 5,994,720 A | 11/1999 | Snyman et al. |

(Continued)

FOREIGN PATENT DOCUMENTS

| DE | 10 2004 042 997 | 12/2005 |
| EP | 0 276 140 | 7/1988 |

OTHER PUBLICATIONS

M. Reine et al., "Independently Accessed Back-to-Back HgCdTe photodiodes: a new dual-band infrared detector", 1995, Journal of Electron Materials, vol. 24, No. 5.*

(Continued)

*Primary Examiner* — Jerome Jackson, Jr.
*Assistant Examiner* — Bo Fan
(74) *Attorney, Agent, or Firm* — Nixon & Vanderhye PC

(57) ABSTRACT

A semiconductor light emitting device (10) comprises a semiconductor structure (12) comprising a first body (14) of a first semiconductor material (in this case Ge) comprising a first region of a first doping kind (in this case n) and a second body (18) of a second semiconductor material (in this case Si) comprising a first region of a second doping kind (in this case p). The structure comprises a junction region (15) comprising a first heterojunction (16) formed between the first body (14) and the second body (18) and a pn junction (17) formed between regions of the structure of the first and second doping kinds respectively. A biasing arrangement (20) is connected to the structure for, in use, reverse biasing the pn junction, thereby to cause emission of light.

11 Claims, 6 Drawing Sheets

(56) References Cited

U.S. PATENT DOCUMENTS

| | | | |
|---|---|---|---|
| 6,111,271 | A * | 8/2000 | Snyman et al. ............... 257/80 |
| 6,278,134 | B1 | 8/2001 | Capasso et al. |
| 8,362,679 | B2 | 1/2013 | Du Plessis |
| 8,395,226 | B2 | 3/2013 | Du Plessis et al. |
| 2011/0031893 | A1 | 2/2011 | Snyman et al. |
| 2011/0042701 | A1 | 2/2011 | Du Plessis et al. |
| 2012/0001681 | A1 | 1/2012 | Du Plessis |
| 2012/0009709 | A1 | 1/2012 | Du Plessis |
| 2013/0026534 | A1 | 1/2013 | Venter |

OTHER PUBLICATIONS

Du Plessis et al., "Spectral Characteristics of Si Light Emitting Diodes in a 0.8 / spl mu/m BiCMOS Technology", Optoelectronic and Microelectronic Materials Devices, 1998. Proceeding S. 1998 Conference on Perth, WA, Australia Dec. 14-16, 1998, Piscataway NJ, USA, IEEE, pp. 228-231, XP010350122.

International Search Report for PCT/IB2009/050378, mailed Jul. 22, 2009.

International Preliminary Report on Patentability for PCT/IB2009/050378, completed/mailed Feb. 17, 2010.

U.S. Appl. No. 13/810,809 (Du Plessis et al.) filed Apr. 1, 2013.

U.S. Appl. No. 13/574,333 (Venter, Petrus Johannes) filed Jul. 20, 2012.

U.S. Appl. No. 13/161,113 (Du Plessis) filed Jun. 15, 2011.

U.S. Appl. No. 13/139,653 (Du Plessis) filed Jun. 14, 2011.

U.S. Appl. No. 12/863,743 (Snyman et al.) filed Jul. 20, 2010.

U.S. Appl. No. 12/740,597 (Du Plessis et al.) filed Oct. 20, 2010.

* cited by examiner

SEMICONDUCTOR LIGHT EMITTING DEVICE COMPRISING HETEROJUNCTION

This application is the U.S. national phase of International Application No. PCT/IB2009/050378, filed 30 Jan. 2009, which designated the U.S. and claims priority to South African Application No. 2008/01088 filed 1 Feb. 2008, the entire contents of each of which are hereby incorporated by reference.

INTRODUCTION AND BACKGROUND

This invention relates to semiconductor optoelectronic devices and more particularly to a semiconductor light emitting device and a method of emitting light.

Monolithic semiconductor light emitting devices, such as silicon (Si) devices comprising a pn junction, which in use is reverse biased into a breakdown mode to emit light, are known. Biasing the pn junction in avalanche or field emission breakdown, causes a current to increase, and due to energetic carriers in a high electric field of a depletion region associated with the junction, radiative recombination and transitions occur to generate photons in an indirect bandgap semiconductor material this radiative process is not the dominating carrier interaction taking place, which renders an electron-to-photon quantum efficiency, which may not be satisfactory.

OBJECT OF THE INVENTION

Accordingly, it is an object of the present invention to provide an alternative semiconductor light emitting device and a method of emitting light with which the applicant believes the aforementioned disadvantages may at least be alleviated.

SUMMARY OF THE INVENTION

According to the invention there is provided a light emitting device comprising:
 a semiconductor structure comprising
 a first body of a first semiconductor material comprising a first region of a first doping kind;
 a second body of a second semiconductor material comprising a first region of a second doping kind;
 a junction region comprising a first heterojunction formed between the first body and the second body and a pn junction formed between regions of the structure of the first and second doping kinds respectively; and
 a biasing arrangement connected to the structure for, in use, reverse biasing the pn junction, thereby to cause emission of light.

At least one of the first semiconductor material and the second semiconductor material may comprise an indirect bandgap semiconductor material. In other embodiments at least one of the first semiconductor material and the second semiconductor material may comprise a direct bandgap semiconductor material.

Preferably, the first semiconductor material comprises an indirect bandgap semiconductor material and the second semiconductor material comprises an indirect bandgap semiconductor material.

In an embodiment wherein both the first and the second semiconductor material comprises an indirect bandgap semiconductor material an energy bandgap between a conduction band and a valence band of the first semiconductor material is preferably smaller than an energy bandgap between a conduction band and a valence band of the second semiconductor material.

At least the first semiconductor material may comprise a silicon germanium alloy $Si_{1-x}Ge_x$, and wherein $0 \leq x \leq 1$.

In other embodiments, the first semiconductor material may comprise a silicon germanium alloy $Si_{1-x1}Ge_{x1}$, and the second semiconductor material may comprise $Si_{1-x2}Ge_{x2}$, wherein $x2 < x1$.

The first doping kind may be n and the second doping kind may be p. In other embodiments opposite doping kinds may be used.

The biasing arrangement may be used to reverse bias the first pn junction into a breakdown mode. The breakdown mode may be one of avalanche breakdown; field emission breakdown; and a combination of avalanche breakdown and field emission breakdown.

The first heterojunction and the pn junction coincide. In other embodiments they may be spaced from one another.

The first body may comprise a germanium layer located on the second body comprising a silicon or SOI (silicon on insulator) substrate as commonly used in integrated circuit technology, for example CMOS.

The junction region may comprise a second region of the second semiconductor material of the first doping kind, the heterojunction may be formed between the first body and the second region of the second body and the pn junction may be formed between the second region of the second body and the first region of the second body, so that the heterojunction is spaced from the pn junction by the second region of the second body.

In another embodiment of the device a second pn junction may be formed between the first region of the first body and one of a further body of the second semiconductor material of the second doping kind and a second region of the first body of the second doping kind and the biasing means may be configured to forward bias the second pn junction.

In still another embodiment of the device the junction region may comprising a train of alternate layers of the second semiconductor material of the first doping kind and the first semiconductor material of the first doping kind between the second body and the further body or second region of the first body of the second doping kind.

According to another aspect of the invention there is provided a method of emitting light comprising the steps of:
 utilizing a semiconductor structure comprising a first body of a first semiconductor material comprising a first region of a first doping kind, a second body of a second semiconductor material comprising a first region of a second doping kind, a junction region comprising a first heterojunction formed between the first body and the second body and a pn junction formed between regions of the structure of the first and second doping kinds respectively; and
 reverse biasing the first pn junction, thereby to cause emission of light.

The first heterojunction is preferably reverse biased into a breakdown mode. The breakdown mode is one of avalanche breakdown, field emission breakdown and a combination of avalanche breakdown and field emission breakdown.

BRIEF DESCRIPTION OF THE ACCOMPANYING DIAGRAMS

The invention will now further be described, by way of example only, with reference to the accompanying diagrams wherein.

DESCRIPTION OF A PREFERRED EMBODIMENT OF THE INVENTION

Figure 3:
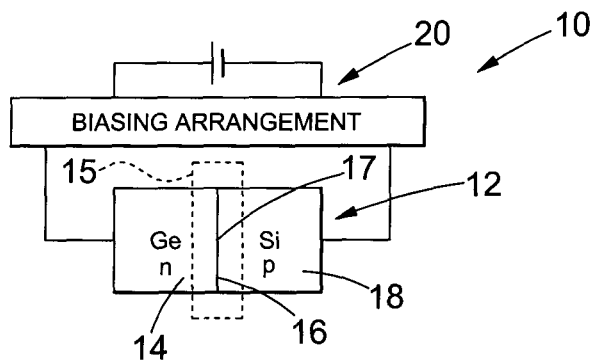
FIG. 3 is a diagrammatic representation of a first embodiment of a light emitting device according to the invention.

A light emitting device according to the invention is generally designated by the reference numeral 10 in FIG. 3.

The device 10 comprises a semiconductor structure 12. The structure comprises a first body 14 of a first semiconductor material (in this case Ge) comprising a first region of a first doping kind (in this case n) and a second body 18 of a second semiconductor material (in this case Si) comprising a first region of a second doping kind (in this case p). A junction region 15 comprises a first heterojunction 16 between the first body 14 and the second body 18 and a pn junction 17 between regions of the structure 12 of the first and second doping kinds, respectively. A biasing arrangement 20 is connected to the structure for, in use, reverse biasing the pn junction, thereby to cause emission of light. In this embodiment the heterojunction 16 and pn junction 17 coincide. In other embodiments, they may be spaced from one another, as hereinafter described.

Figure 1:
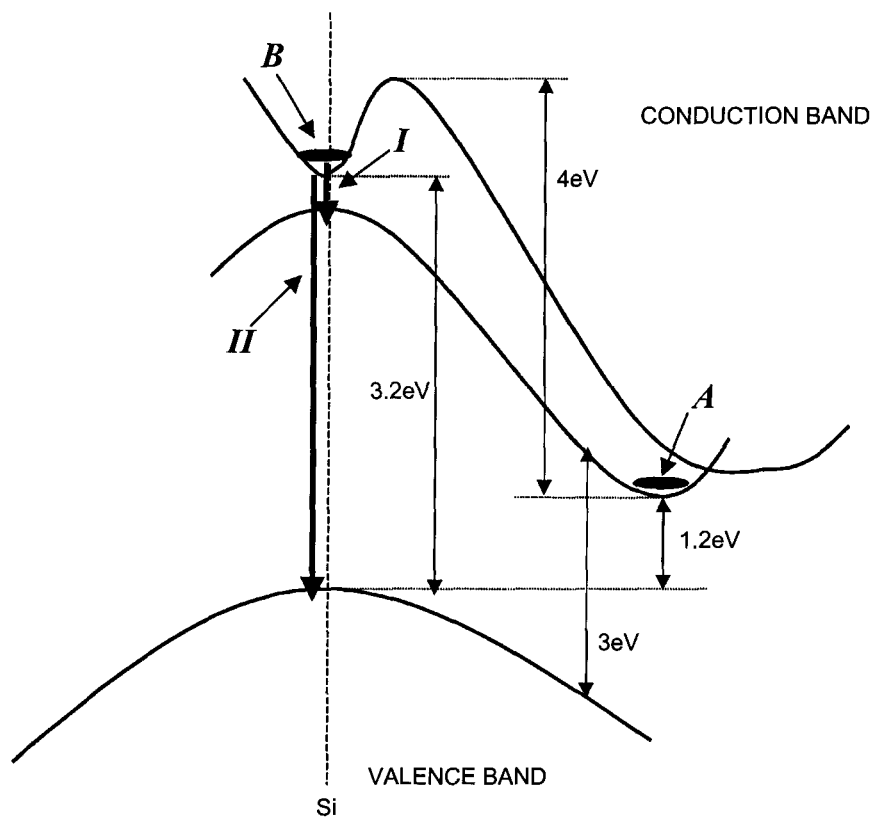
FIG. 1 is a diagrammatic and known energy band diagram of the indirect bandgap semiconductor material, silicon.
Figure 2:
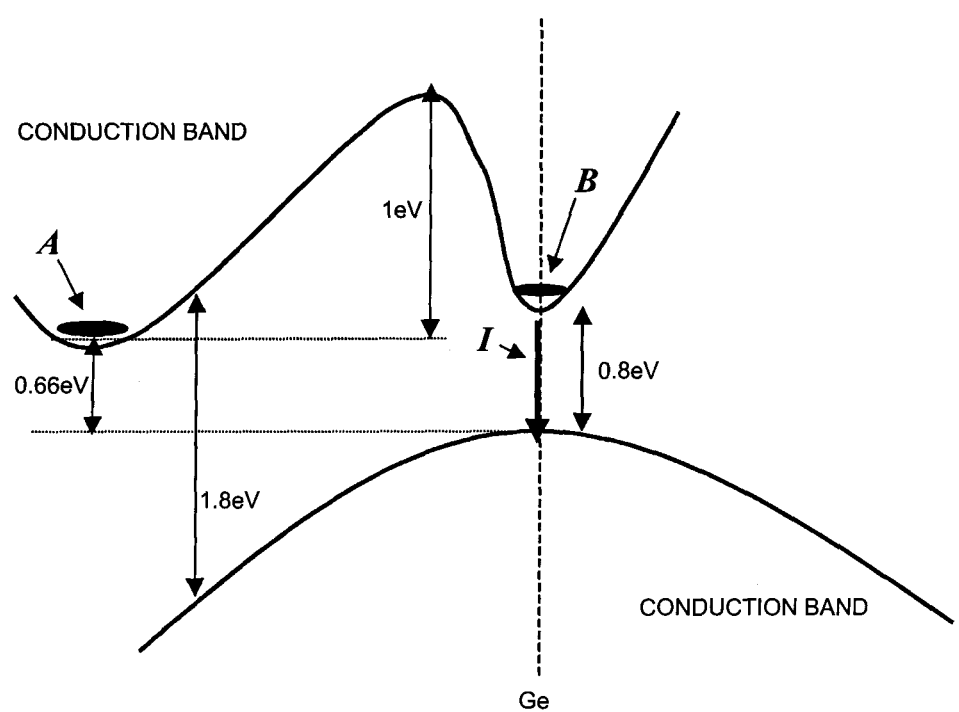
FIG. 2 is a diagrammatic and known energy band diagram of the indirect bandgap semiconductor material, germanium.

Referring to FIGS. 1 and 2, shortcomings of prior art devices are described. In FIG. 1 there is shown a diagrammatic energy band diagram of indirect bandgap semiconductor material, silicon. Two possible radiative and efficient direct band-to-band recombination and energy transitions are shown as transition I and transition II. To activate these two transitions, electrons must be present in the valley B (also commonly referred to as the T ("Tau") valley in scientific literature for germanium) shown in FIG. 1. Normally the valley A (also commonly referred to as the L valley in scientific literature for germanium) has electrons present, since it is the point of lowest energy available. However, if suitable conditions could be established, valley B may also be filled with carriers. From FIG. 1 it can be seen that the electrons need an extra energy of at least 4 eV to cross the barrier and to fill valley B. In avalanche conditions, the impact ionization energy of electrons in Si is in the order of 1.8 eV (typically the threshold energy for impact ionization is estimated as 1.5 times the band gap energy, with band gap energy for Si indicated as 1.2 eV in FIG. 1). This means that as soon as an electron in the conduction band is energized by more than 1.8 eV, the electron will react with host Si atoms, and cause impact ionization of the atom. The electron will thus lose its energy during impact ionization. The probability of an electron gaining enough energy to cross the 4 eV barrier to reach valley B under avalanching conditions is very small, and radiative direct transitions I and II would hence not occur.

Referring to the diagrammatic energy band diagram for indirect bandgap semiconductor material Ge in FIG. 2, it is evident that the barrier to cross from the conduction band minimum valley A to the local minimum valley B is only 1 eV. Due to the lower bandgap energy of Ge (0.66 eV), the threshold energy for impact ionization will also be smaller than that of Si. For Ge the threshold energy for impact ionization is typically in the order of 0.8 eV to 0.9 eV. This means that under avalanching conditions, a small number of electrons may cross the barrier from valley A to valley B, but on average, the energy of the electrons is still too small to make a big impact on the quantum efficiency of light emission. However, it has been noted that the radiative transitions in Ge leads to a higher quantum efficiency compared to Si.

Referring again to FIG. 3 and according to the invention semiconductor light emitting device 10 comprises a semiconductor structure 12 comprising a first body 14 of a first semiconductor material (in this case Ge) comprising a first region of a first doping kind (in this case n) and a second body 18 of a second semiconductor material (in this case Si) comprising a first region of a second doping kind (in this case p). A junction region 15 comprises a first heterojunction 16 between the first body 14 and the second body 18 and a pn junction 17 between regions of the structure 12 of the first and second doping kinds, respectively. A biasing arrangement 20 is connected to the structure for, in use, reverse biasing the pn junction, thereby to cause emission of light.

The germanium body may comprise a layer of germanium on a silicon or SOI (silicon on insulator) substrate as commonly used in integrated circuit technology, for example CMOS. The junction may be formed in any suitable growth and processing manner, such as epitaxy or chemical bonding.

Figure 4:
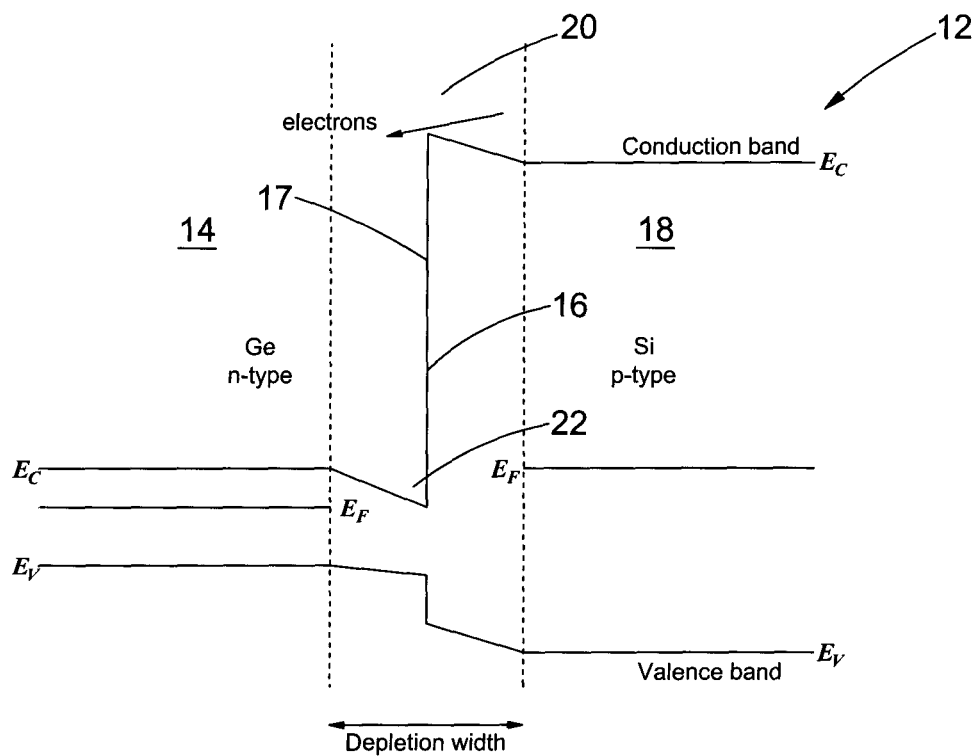
FIG. 4 is a diagrammatic energy band diagram of the device in FIG. 3.

FIG. 4 shows a diagrammatic energy band diagram for the device in FIG. 3. The junction 17 is reverse biased (indicated by the shift in Fermi levels $E_F$). Since electrons will move into depletion region 20 from the p-type material, and in silicon the ionization probability of electrons will be more than that of holes, a large number of excess electrons will be generated in the depletion region on the silicon side as a result of impact ionization. These electrons will drift towards the n-side 14 of the junction 16,17 under the influence of the electric field. When the electrons cross the metallurgical junction 16 from Si to Ge, a large number of these electrons will be activated to an energy level of more than 1 eV above the conduction band. (The threshold energy for impact ionization in Si is about 1.8 eV). This means that as the electrons enter the Ge side of the junction, they have energy higher than the barrier of 1 eV that prevents movement of electrons to valley B, as shown in FIG. 2. This means that a large quantity of electrons drifting into the Ge side of the junction from the Si side will fill valley B on the Ge side. In Ge, the ionization coefficient of holes is more than that of electrons, and it is expected that a significant number of the electrons drifting into the Ge side will not take part in impact ionization, but will be available for direct recombination with holes, shown as transition I in FIG. 2. At the same time, holes will move into the depletion region 20 from the n-side. Since the hole impact ionization in Ge is larger than that of electrons, the holes will multiply on the Ge side of the junction, generating a large number of holes that can recombine with the electrons drifting from the Si side and filling the valley B. It is also expected that there will be formed on the Ge side of the heterojunction 16, a region 22, similar to a quantum well, where carriers may be confined to a certain volume or space in the pn junction region, facilitating further direct recombination of the energetic carriers.

Hence, is expected that with the reverse biased heterojunction 16, energetic electrons are injected into the Ge 14 from the Si side 18 of the junction 16. At least some of these electrons are expected to fill the local valley B shown in FIG. 2, and direct radiative transitions are expected to be activated, increasing the quantum efficiency of the light emission process. At the same time, a potential well 22 (or quantum well) is formed in the Ge body 14 adjacent the metallurgical junction 16, causing carriers to be confined in that volume, resulting in even more radiative transitions.

The first body 14 of a semiconductor material may comprise $Si_{1-x1}Ge_{x1}$ and the second body 18 of semiconductor material may comprise $Si_{1-x2}Ge_{x2}$. In the embodiment described hereinbefore X2<X1. By using the $Si_{1-x}Ge_x$ alloys, the band structure can be varied, by varying the alloy composition factor x. A $Si:Si_{1-x}Ge_x$ heterojunction can be used to change the band structure, as well the value of the threshold energy for impact ionization, to satisfy different requirements of emission wavelength, operating voltage, etc.

It is expected that under certain conditions, an inverse polarity pn heterojunction, that is with the Si body 18 being of doping kind n and the Ge body 14 being of doping kind p, may also lead to improvement in quantum efficiency.

The electric field strengths as a function of distance in the Ge body 14 and the Si body 18 may be of comparable values. With impact ionization coefficients of carriers being higher in Ge than in Si, one would expect the avalanche breakdown mechanism to occur first on the Ge side of the junction 16, with the associated increase in reverse current, before breakdown has occurred in the Si side of the junction. This may result in only a small amount of energetic electrons moving from the Si to the Ge side of the junction, leading to higher electron injection levels and reducing the advantage of increased quantum efficiency as hereinbefore described.

Figure 5:
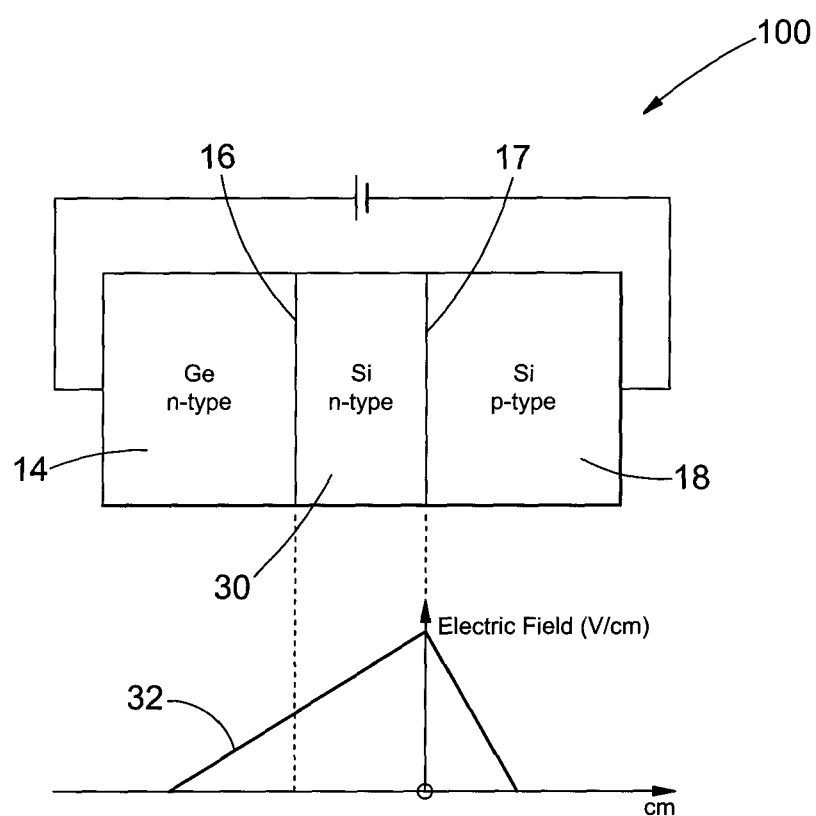
FIG. 5 is a diagrammatic representation of a further embodiment of the light emitting device.

A further embodiment of the device 100 is shown in FIG. 5 comprising a thin second n-type Si region 30 between the first body 14 and the second body 18. In this case the heterojunction 16 is spaced from the first pn junction 17 by the second Si region 30. In the electric field profile 32 in the pnn Si:Ge heterojunction shown in FIG. 5, second order effects of crystal strain, interface charges, permittivity differences, etc. have been neglected, which may cause a discontinuity (not shown) in the electric field profile at the heterojunction junction.

The second and central n-type Si region 30 may be narrow, causing some of the depletion region to spread into the n-type Ge, causing a lower electric field strength within the n-type Ge. This configuration may be used to ensure that avalanche breakdown will occur first in the higher electric field strength Si side of the junction, with energetic electrons being injected from the Si into the Ge.

Figure 6:
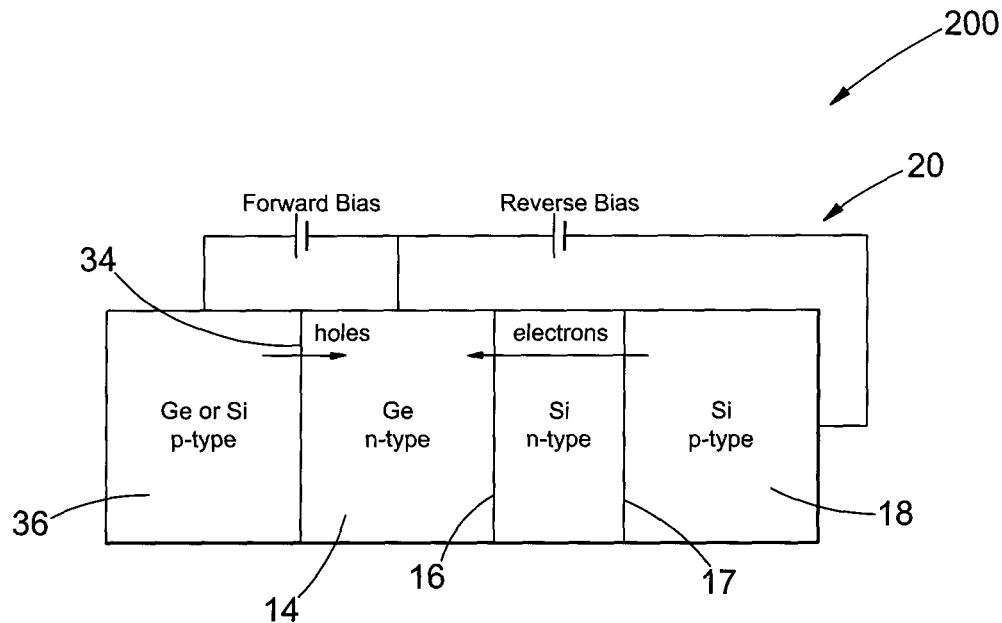
FIG. 6 is a diagrammatic representation of yet another embodiment of the light emitting device.

To have radiative recombination and energy transitions, the large number of energetic electrons drifting into the n-type Ge must be mixed in the same volume with large number of holes. The holes in the n-type Ge can be provided from two sources, depending on the value of the electric field in the Ge. If the electric field in the n-type Ge is large enough, avalanche impact ionization can also occur in the n-type Ge, generating a large quantity of holes in the n-type Ge to interact with the large number of electrons drifting from the Si side. This will increase the quantum efficiency of photon generation. Alternatively and as shown in the embodiment 200 in FIG. 6, if the electric field in the n-type Ge is not present or too small to initiate impact ionization, then a large quantity of holes can be injected into the n-type Ge 14 from a nearby forward biased second pn junction 34, formed between the n-type Ge body 14 and a p-type Si body 36 or p-type Ge region.

Figure 7:
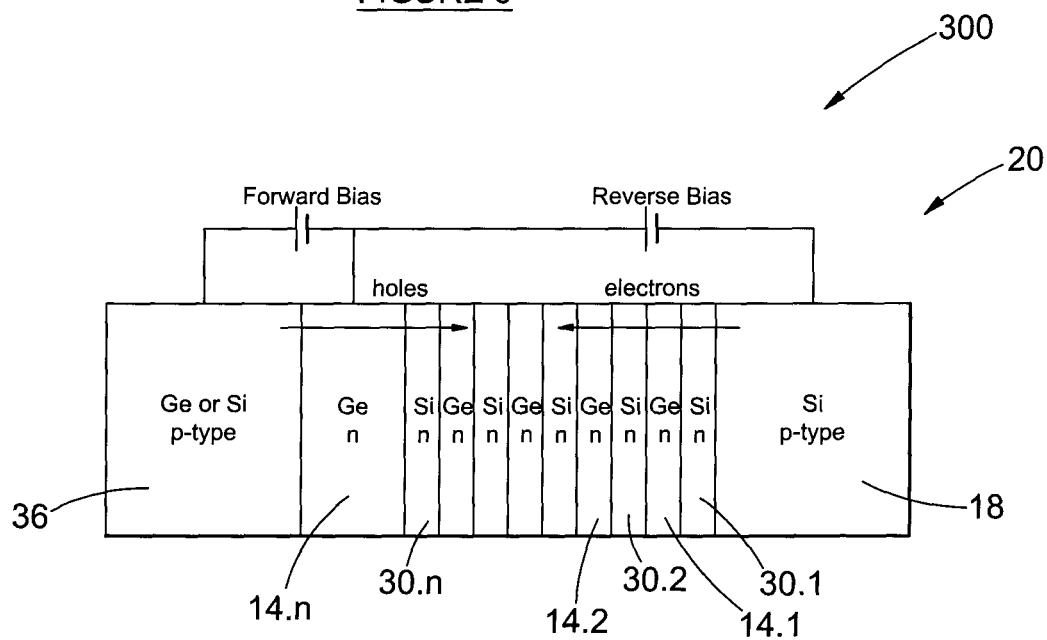
FIG. 7 is a diagrammatic representation of still another embodiment of the light emitting device.

In FIG. 7 there is shown a still further embodiment of the light emitting device designated 300. A train of alternate thin layers of n-type Ge (14.1 to 14.$n$) and n-type Si (30.1 to 30.$n$) is provided adjacent the second body 18 of p-type Si. Making the thickness of the n-type layers very thin (thickness in the order of a few nm), a cascade of quantum wells may be formed. The quantum wells are expected to have high concentrations of both electrons and holes, confined in a small volume, and this configuration will enhance the direct band-to-band recombination of electrons and holes leading to the emission of photons with increased quantum efficiency.

Figure 8:
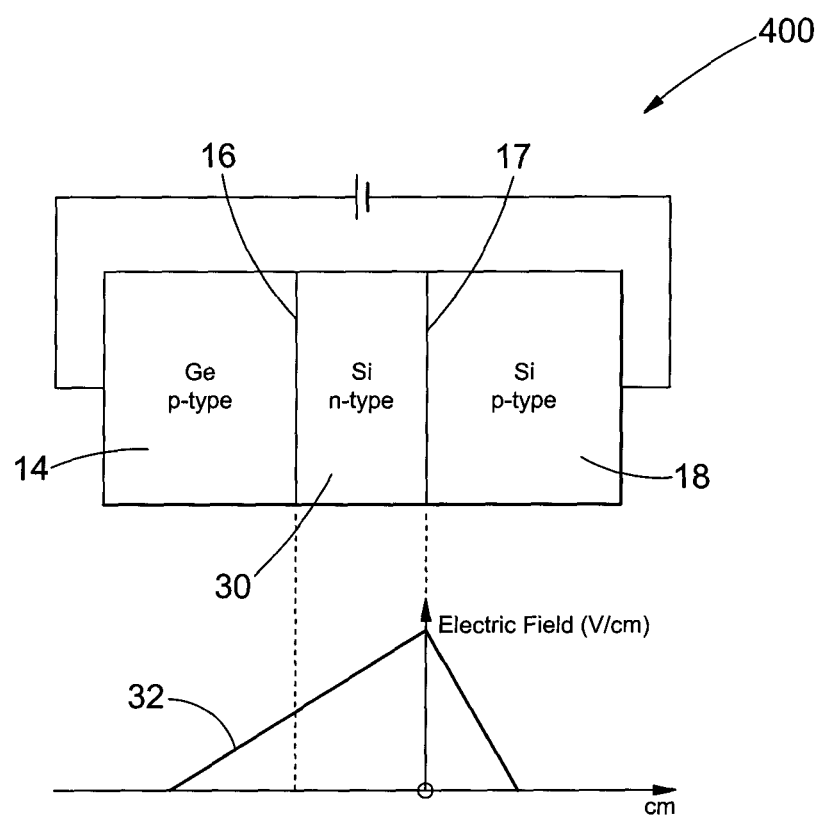
FIG. 8 is a diagrammatic representation of still a further embodiment of the light emitting device.

A yet further embodiment of the device 400 is shown in FIG. 8 wherein the outer n-type Ge region 14 of the device shown in FIG. 5 is replaced with a p-type Ge region. In this case the heterojunction 16 is spaced from the first pn junction 17 by the second Si region 30. In the electric field profile 32 in the pnp Si:Ge heterojunction shown in FIG. 8, second order effects of crystal strain, interface charges, permittivity differences, etc. have been neglected, which may cause a discontinuity not shown) in the electric field profile at the heterojunction junction.

The second and central n-type Si region 30 may be narrow, causing some of the depletion region to spread into the p-type Ge, causing a lower electric field strength within the p-type Ge. This configuration may be used to ensure that avalanche breakdown will occur first in the higher electric field strength Si side of the junction, with energetic electrons being injected from the Si into the Ge.

This configuration will allow high energy electrons as generated by the Si pn junction to penetrate the p-type Ge if the device is properly dimensioned and biased. Since the electrons are of high energy but are injected into a low electric field region of the p-type Ge, they will populate primarily the B valley in the Ge, enhancing direct recombination. The doping of the Ge being p-type ensures direct recombination. The doping of the Ge being p-type further ensures a large density of surrounding holes being present in the Ge, causing an enhanced direct recombination and light emission. Since both a carrier energy conversion as well as a carrier density population inversion are created, the device could stimulate laser operation as well.

Under certain conditions the direct band-to-band recombination, combined with carrier and photon confinement techniques, may lead to laser action in the reverse biased mode of the structure.

The invention claimed is:

1. A light emitting device comprising:
   a semiconductor structure comprising:
      a first body of a first semiconductor material which is an indirect bandgap material having a first bandgap and comprising a first region of a first doping kind;
      a second body of a second semiconductor material having a second bandgap and comprising a first region of a second doping kind;
      wherein the first bandgap is smaller than the second bandgap;
      a junction region comprising a first heterojunction formed between the first body and the second body and a first pn junction formed between adjacent regions of the structure of the first and second doping kinds respectively;
      the first pn junction being located in the second body on one side of the first heterojunction and spaced from the first heterojunction by a second region of the second body of the first doping kind;

a biasing arrangement connected to the structure cooperating with a first carrier injection mechanism comprising the first pn junction and arranged to reverse bias the first pn junction into a breakdown mode and to fully deplete the second region of the second body to cause carriers of a first polarity to be injected into the first body to populate a direct valley and to cause direct radiative recombination of carriers in the first body, thereby to cause emission of light from the first body;

a second carrier injection mechanism comprising a second pn junction provided on the other side of the first heterojunction; and wherein the biasing arrangement is also arranged to forward bias the second pn junction to inject into the first body carriers of an opposite polarity.

2. The light emitting device as claimed in claim 1 wherein the second semiconductor material is an indirect bandgap semiconductor material.

3. The light emitting device as claimed in claim 1, wherein at least the first semiconductor material comprises $Si_{1-x}Ge_x$, and wherein $0 \leq x \leq 1$.

4. The light emitting device as claimed in claim 3 wherein the first semiconductor material comprises $Si_{1-x1}Ge_{x1}$, wherein the second semiconductor material comprises $Si_{1-x2}Ge_{x2}$, and wherein $x2 < x1$.

5. The light emitting device as claimed in claim 1, wherein the first doping kind is n and the second doping kind is p.

6. The light emitting device as claimed in claim 1, wherein the first doping kind is p and the second doping kind is n.

7. The light emitting device as claimed in claim 1, wherein the breakdown mode is one of avalanche breakdown; field emission breakdown; and a combination of avalanche breakdown and field emission breakdown.

8. The light emitting device as claimed in claim 1, wherein the second pn junction is formed between the first region of the first body and one of a further body of the second semiconductor material of the second doping kind or a second region of the first body of the second doping kind.

9. The light emitting device as claimed in claim 8 comprising a train of alternate layers of the second semiconductor material of the first doping kind and the first semiconductor material of the first doping kind between the second body and the first body.

10. A method of emitting light comprising the steps of:
providing a semiconductor structure comprising:
a first body of a first semiconductor material which is an indirect bandgap material comprising a first bandgap and comprising a first region of a first doping kind, a second body of a second semiconductor material having a second bandgap comprising a first region of a second doping kind, the first bandgap being smaller than the second bandgap, a junction region comprising a first heterojunction formed between the first body and the second body and a first pn junction formed between adjacent regions of the structure of the first and second doping kinds respectively;

the first pn junction being located in the second body on one side of the first heterojunction and spaced from the first heterojunction by a second region of the second body of the first doping kind;

a second pn junction provided on the other side of the heterojunction; and a biasing arrangement connected to the structure to cooperate with a first carrier injection mechanism comprising the first pn junction and with a second carrier injection mechanism comprising the second pn junction, reverse biasing the first pn junction into a breakdown mode to fully deplete the second region of the second body to cause carriers of a first polarity to be injected into the first body to populate a direct valley and to cause direct radiative recombination of carriers in the first body, thereby to cause emission of light from the first body; and forward biasing the second pn junction to inject into the first body carriers of an opposite polarity.

11. The method as claimed in claim 10, wherein the breakdown mode is one of avalanche breakdown, field emission breakdown and a combination of avalanche breakdown and field emission breakdown.

* * * * *